United States Patent
Tumati et al.

(10) Patent No.: US 10,848,107 B2
(45) Date of Patent: Nov. 24, 2020

(54) TRANSIMPEDANCE AMPLIFIERS FOR ULTRASONIC SENSING APPLICATIONS

(71) Applicant: Analog Devices Global Unlimited Company, Hamilton (BM)

(72) Inventors: Sanjay Tumati, Secunderabad (IN); Vinayak Agrawal, Uttar Pradesh (IN); John A. Cleary, Kilmallock (IE)

(73) Assignee: ANALOG DEVICES GLOBAL UNLIMITED COMPANY, Hamilton (BM)

( * ) Notice: Subject to any disclaimer, the term of this patent is extended or adjusted under 35 U.S.C. 154(b) by 14 days.

(21) Appl. No.: 16/211,646

(22) Filed: Dec. 6, 2018

(65) Prior Publication Data
US 2020/0136565 A1  Apr. 30, 2020

(30) Foreign Application Priority Data
Oct. 25, 2018  (IN) .............................. 201841040338

(51) Int. Cl.
| | |
|---|---|
| H03F 1/08 | (2006.01) |
| H03F 1/30 | (2006.01) |
| H03F 1/26 | (2006.01) |
| H03F 1/48 | (2006.01) |
| G06K 9/00 | (2006.01) |
| H01L 41/113 | (2006.01) |
| B06B 1/06 | (2006.01) |

(52) U.S. Cl.
CPC .............. H03F 1/086 (2013.01); B06B 1/06 (2013.01); G06K 9/0002 (2013.01); H01L 41/1132 (2013.01); H03F 1/26 (2013.01); H03F 1/301 (2013.01)

(58) Field of Classification Search
USPC .................................. 330/250, 282, 291–293
See application file for complete search history.

(56) References Cited

U.S. PATENT DOCUMENTS 9,379,674 B2 *  6/2016  Kim ........................ H03F 1/483

OTHER PUBLICATIONS

Gomez et al., *Process and Temperature Compensation for RF Low-Noise Amplifiers and Mixers*, IEEE Transactions on Circuits and Systems—I: Regular Papers, vol. 57, No. 6, Jun. 2010, 8 pages.
(Continued)

*Primary Examiner* — Hieu P Nguyen
(74) *Attorney, Agent, or Firm* — Patent Capital Group

(57) ABSTRACT

Various transimpedance amplifier (TIA) arrangements for ultrasonic front-end receivers used in ultrasonic sensing applications are disclosed. An example TIA includes three common-source gain stages in a feedback loop with a common-gate stage. In some aspects, the TIA may include a level shifter configured to maintain the voltage at the gate of a transistor used to implement the first common-source gain stage of the feedback loop shifted by a certain amount with respect to the voltage at an input port to the TIA. In some aspects, at least portions of the TIA may be biased using bias currents that are configured to be process-, supply voltage-, and/or temperature-dependent. Various embodiments of the TIAs disclosed herein may benefit from one or more of the following advantages: reduced noise, reduced input impedance, reduced temperature coefficient of input impedance, and stability for a wide range of sensor frequencies.

23 Claims, 5 Drawing Sheets

(56) References Cited

OTHER PUBLICATIONS

Ye et al., *Wideband Common-Gate Low-Noise Amplifier with Dual-Feedback for Simultaneous Input and Noise Matching*, 978-1-4244-8292-4/11 © 2011 IEEE, 4 pages.
Xu et al., *Challenges and Considerations of Analog Front-ends Design for Portable Ultrasound Systems*, 2010 IEEE International Ultrasonics Symposium Proceedings, 4 pages.
Wygant et al., *An Integrated Circuit with Transmit Beamforming Flip-Chip Bonded to a 2-D CMUT Array for 3-D Ultrasound Imaging*, IEEE Transactions on Ultrasonics, Ferroelectrics, and Frequency Control, vol. 56, No. 10, Oct. 2009, 12 pages.
Li et al., *Gm-Boosted Common-Gate LNA and Differential Colpitts VCO/QVCO in 0.18-µm CMOS*, IEEE Journal of Solid-State Circuits, vol. 40, No. 12, Dec. 2005, 11 pages.
Vermesan et al., *A BiCMOS Ultrasound Front End Signal Processor for High Temperature Applications*, Proceedings of ESSCIRC, Grenoble, France 2005, 4 pages.
Cheng et al., *CMOS Ultrasonic Receiver with ON-Chip Analog-to-Digital Front End for High-Resolution Ultrasound Imaging Systems*, IEEE Sensors Journal, vol. 16, No. 20, Oct. 15, 2016, 10 pages.
Sharma et al., *Low Noise Front-end Amplifier Design for Medical Ultrasound Imaging Applications*, 2012 IEEE/IFIP 20th International Conference on VLSI and System-on-Chip, 5 pages.
Wang et al., *Surfing Front-end Architectures for Ultrasound Imaging Systems*, 2015 European Conference on Circuit Theory and Design (ECCTD), © 2015 IEEE, 4 pages.
Lee et al., *A Rail-to-Rail CMOS Operational Amplifier with Programmable Compensation Schemes*, 0-7803-7749-4/03 © 2003 IEEE, 4 pages.
Brunner, *Ultrasound System Considerations and their Impact on Front-End Components*, © Analog Devices, Inc., 2002, 19 pages.
Eriksrod et al., *A 65nm CMOS Front-end LNA for Medical Ultrasound Imaging with Feedback Employing Noise and Distortion Cancellation*, 2013 European Conference on Circuit Theory and Design (ECCTD), 4 pages.
Gu et al., *Design of a Programmable Gain, Temperature Compensated Current-Input Current-Output CMOS Logarithmic Amplifier*, IEEE Transactions on Biomedical Circuits and Systems, vol. 8, No. 3, Jun. 2014, 9 pages.
Gurun et al., *Front-End Receiver Electronics for High-Frequency Monolithic CMUT-on-CMOS Imaging Arrays*, IEEE Transactions on Ultrasoncis, Ferroelectrics, and Frequency Control, vol. 58, No. 8, Aug. 2011, 11 pages.

\* cited by examiner

US 10,848,107 B2

TRANSIMPEDANCE AMPLIFIERS FOR ULTRASONIC SENSING APPLICATIONS

CROSS-REFERENCE TO PRIORITY DATA

This application is a non-provisional application and claims benefit to Indian Provisional Application Serial No. 201841040338 filed Oct. 25, 2018 entitled, "TRANSIMPEDANCE AMPLIFIERS FOR ULTRASONIC SENSING APPLICATIONS", which is incorporated herein by reference in its entirety.

TECHNICAL FIELD OF THE DISCLOSURE

The present disclosure relates generally to amplifier design and, more specifically, to amplifiers for ultrasonic sensing applications.

BACKGROUND

Ultrasonic sensing can be used in a variety of applications. One example is fingerprint sensing. Although there are many approaches to fingerprint sensing, such as optical, capacitive, and direct pressure, ultrasonic fingerprint sensing is particularly attractive because it is resilient against the negative effects of dirt, grease, particles, and other contaminants that may affect measurements using other approaches.

An ultrasonic sensor system includes an ultrasonic receiver, also referred to herein as an ultrasonic front-end receiver, which includes an ultrasonic sensor (e.g., a piezoelectric transducer (PZT)) as a receiving element/sensor, and further includes a transimpedance amplifier (TIA). The PZT is configured to receive, through an ultrasonic transmitting media, an ultrasonic signal/wave that has interacted with an object being analyzed (e.g., with a finger, if fingerprint is the desired objecting of the ultrasonic sensing). The PZT is further configured to provide to the TIA a current signal indicative of the ultrasonic signal that has been received (in some implementations, the same PZT may also be used to transmit an ultrasonic signal to begin with, which signal may then interact with the object being analyzed and be reflected from said object, so that the reflected ultrasonic signal is then received by the PZT). The TIA is configured to convert the current received from the PZT into a voltage, which voltage may then be used to determine one or more characteristics intended to be analyzed using ultrasound, e.g., to determine a fingerprint.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
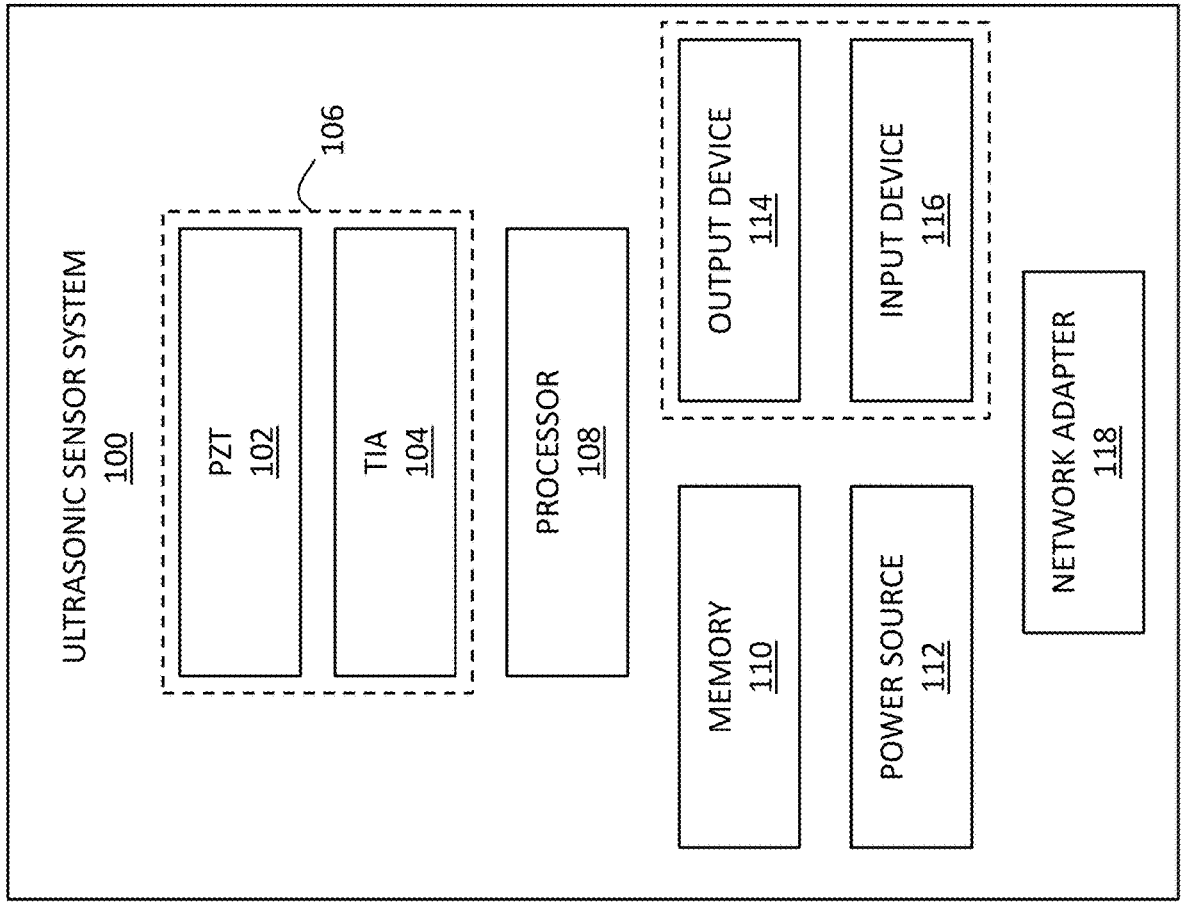
FIG. 1 provides a block diagram illustrating an example ultrasonic sensor system according to some embodiments of the present disclosure.

The systems, methods and devices of this disclosure each have several innovative aspects, no single one of which is solely responsible for the all of the desirable attributes disclosed herein. Details of one or more implementations of the subject matter described in the present disclosure are set forth in the description below and the accompanying drawings.

TIA is an important component in any ultrasonic front-end receiver because if current generated by the PZT is not correctly converted into voltage, errors will arise in determining characteristics (e.g., to determine/identify a fingerprint) which were intended to be analyzed, or it may be altogether impossible to determine such characteristics. Several challenges exist which make designing TIAs for ultrasonic front-end receivers far from trivial. One challenge is that sensor currents received at an input port of the TIA should be converted with high sensitivity. This is complicated by the fact that, often, PZT sensor currents have very high frequencies, which means that they change quickly and the TIA circuit has to be high-bandwidth in order to be able to handle such currents. Another challenge is that the sensor currents have to be recovered with low noise. Both of these challenges mean that the front-end receiver TIA circuit should be very stable across a variety of deployment scenarios and conditions. Yet another challenge is that input currents (including transient currents during pin configuration changes) to the TIA may reach the limits of linear operation of the TIA, in which cases the TIA may become overloaded. Overloading may cause artefacts to appear in the output voltage produced by the TIA and it may take a long time (in particular when considered against the resonant period of the PZT element, which is typically below about 50 nanoseconds) until the TIA can return to linear operation, i.e. ultrasonic TIAs may have very long relaxation times. Improvements with respect to at least some of these challenges in TIAs used for ultrasonic sensing applications would be desirable.

Embodiments of the present disclosure provide various TIA arrangements for ultrasonic front-end receivers used in ultrasonic sensing applications. An example TIA is a multi-stage TIA device/arrangement that includes three common-source (CS) gain stages in a feedback loop with a common-gate (CG) stage. In some aspects, such a TIA may include a low power level shifter configured to maintain the voltage at the gate of a transistor used to implement the first CS gain stage of the feedback loop shifted by a certain amount with respect to the voltage at an input port to the TIA. In some aspects, at least portions of such a TIA may be biased using bias currents that are dependent on one or more of process variations, supply voltage variations, and temperature variations (i.e., PVT-dependent). Making bias currents PVT-dependent means deliberately making the currents unstable so that they can track PVT variations. Such PVT-dependent biasing is a drastic change from conventional circuit implementations where great efforts are typically made to make bias currents as stable as possible, i.e., to make bias currents not be PVT-dependent. Various embodiments of the TIAs disclosed herein may benefit from one or more of the following advantages: reduced/low noise, reduced/low input impedance (Zin), reduced/low temperature coefficient of input impedance, reduction or elimination of tester calibration requirements, and stability for a wide range of sensor frequencies.

As used herein, describing a current source/bias current as "process-dependent" refers to the design of a bias generation circuit where parameters of the transistors used to generate the bias current intentionally appear as dependent variables in the equations describing the bias current generated. Further, as used herein, describing a current source/bias current as "supply/voltage-dependent" refers to the intentional design choice to create a bias current where the circuit supply voltage has a first order dependency on said voltage. Still further, as also used herein, describing a current source/bias current as "temperature-dependent" refers to the design choice to create a bias current that changes with temperature, e.g., that changes at least linearly with temperature.

Embodiments disclosed herein may be particularly suitable for ultrasonic fingerprint sensing for mobile devices. Mobile devices (or sometimes referred to as handheld devices) within the context of this disclosure include electronic devices which can be held by one or more hands of a user or users (the electronic devices can be completely mobile, and the electronic devices can be tethered to other electronics). Mobile devices can include mobile phones, tablets, laptops, portable speakers, wearable electronics, etc. However, TIA arrangements described herein are not limited to mobile fingerprint applications and are also applicable to ultrasonic sensors in general, e.g., to ultrasonic sensors not used for fingerprint applications, and/or to ultrasonic sensors even if the mobility is limited.

As will be appreciated by one skilled in the art, aspects of the present disclosure, in particular various aspects of TIAs proposed herein, may be embodied in various manners—e.g. as a system, a method, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Various functions described in this disclosure may be implemented as an algorithm executed by one or more hardware processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to the existing devices and systems (e.g. to the existing magnetic sensors and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the claims or select examples. In the following description, reference is made to the drawings where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Other features and advantages of the disclosure will be apparent from the following description and the claims.

Example Ultrasonic Sensor System

FIG. 1 provides a block diagram illustrating an example ultrasonic sensor system 100, according to some embodiments of the present disclosure. As shown in FIG. 1, the system 100 may include a PZT 102, configured to receive an ultrasonic signal, and a TIA 104, configured to convert the current signal generated by the PZT as a result of receiving the ultrasonic signal, to a voltage signal. In some embodiments, the PZT 102 of the system 100 may include a plurality of PZTs, e.g. arranged in an array, and one of more TIAs 104. In some such embodiments, each PZT 102 may be associated with a corresponding TIA 104, which may be beneficial in terms of ability to perform parallel conversion of currents from various PZTs 102. In other embodiments, at least some of the PZTs 102 may share a single TIA 104 (i.e., at single TIA 104 may be used to convert currents to voltages for more than one PZTs 102), which may be beneficial in terms of preserving die area by sharing said TIA. Together, the PZT 102 and the TIA 104 may be considered to be a part of an ultrasonic front-end receiver 106.

In various embodiments, the system 100 may also include one or more of a processor 108, a memory 110, a power source 112, an output device 114, an input device 116, and a network adapter 118.

In some embodiments, the processor 108 can execute software or an algorithm to perform the activities as discussed in the present disclosure, in particular activities related to ultrasonic sensing using the PZT 102. For example, the processor 108 may be configured to communicatively couple the TIA 104 and/or the PZT 102 to other system elements via one or more interconnects or buses. Such a processor may include any combination of hardware, software, or firmware providing programmable logic, including by way of non-limiting example a microprocessor, a digital signal processor (DSP), a field-programmable gate array (FPGA), a programmable logic array (PLA), an application specific integrated circuit (ASIC), or a virtual machine processor. The processor 108 may be communicatively coupled to the memory 110, for example in a direct-memory access (DMA) configuration, so that the processor 108 may read from or write to the memory 110. The memory 110 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from the PZT 102, the TIA 104, the processor 108, the memory 110, the output device 114, or the input device 116 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in FIG. 1, e.g. the PZT 102, the TIA 104, and the processor 108, can also include suitable interfaces for receiving, transmitting, and/or otherwise communicating data or information in a network environment.

In certain example implementations, mechanisms for ultrasonic sensing using the PZT 102 and the TIA 104 as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as e.g. the memory 110 shown in FIG. 1, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g. the processor 108 shown in FIG. 1, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory 110 may include one or more physical memory devices such as, for example, local memory and one or more bulk storage devices. The local memory may refer to RAM or other non-persistent memory device(s) generally used during actual execution of the program code. A bulk storage device may be implemented as a hard drive or other persistent data storage device. The memory 110 may also include one or more cache memories that provide temporary storage of at least some program code in order to reduce the number of times program code must be retrieved from the bulk storage device during execution.

The power source 112 may provide power to substantially all components of the system of FIG. 1. In some implementations, the power source 112 may include one or more battery units.

Input/output (I/O) devices depicted in FIG. 1 as an input device 116 and an output device 114, optionally, can be included within or coupled to the current measurement apparatus 102. Examples of input devices may include, but are not limited to, a keyboard, a pointing device such as a mouse, or the like. The input device 116 may be configured to receive e.g. user input regarding when ultrasonic measurements are to begin, what information is to be output as a result, and in which format. Examples of output devices may include, but are not limited to, a monitor or a display, speakers, or the like. In some embodiments, the output device 114 may be any type of screen display, such as plasma display, liquid crystal display (LCD), organic light emitting diode (OLED) display, electroluminescent (EL) display, or any other indicator, such as a dial, barometer, or LEDs. The output device 114 may be configured to show the result of the ultrasonic sensing performed in accordance with the disclosures herein. For example, the output device 114 may be configured to provide a graphical user interface and display graphical representation of a fingerprint determined using the ultrasonic sensing performed by the system 100. In some implementations, the system may include a driver (not shown) for the output device 114. Input and/or output devices may be coupled to the current measurement apparatus 102 or to the current measurement unit 104 either directly or through intervening I/O controllers.

In an embodiment, the input and the output devices may be implemented as a combined input/output device (illustrated in FIG. 1 with a dashed line surrounding the input device 116 and the output device 114). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 118 may also, optionally, be included within or coupled to the ultrasonic sensing system 100 to enable it to become coupled to other systems, computer systems, remote network devices, and/or remote storage devices through intervening private or public networks. The network adapter 118 may include a data receiver for receiving data that is transmitted by said systems, devices and/or networks to the ultrasonic sensing system 100, and a data transmitter for transmitting data from the ultrasonic sensing system 100 to said systems, devices and/or networks. Modems, cable modems, and Ethernet cards are examples of different types of the network adapter 118.

In some embodiments, some or all of the processor 108, the memory 110, the power source 112, the output device 114, the input device 116, and the network adapter 118 may reside in the same integrated unit as the PZT 102 and the TIA 104. In other embodiments, one or more of these components/devices may reside in a separate unit than the PZT 102 and the TIA 104.

Example Sensor Arrangements

Figure 2:
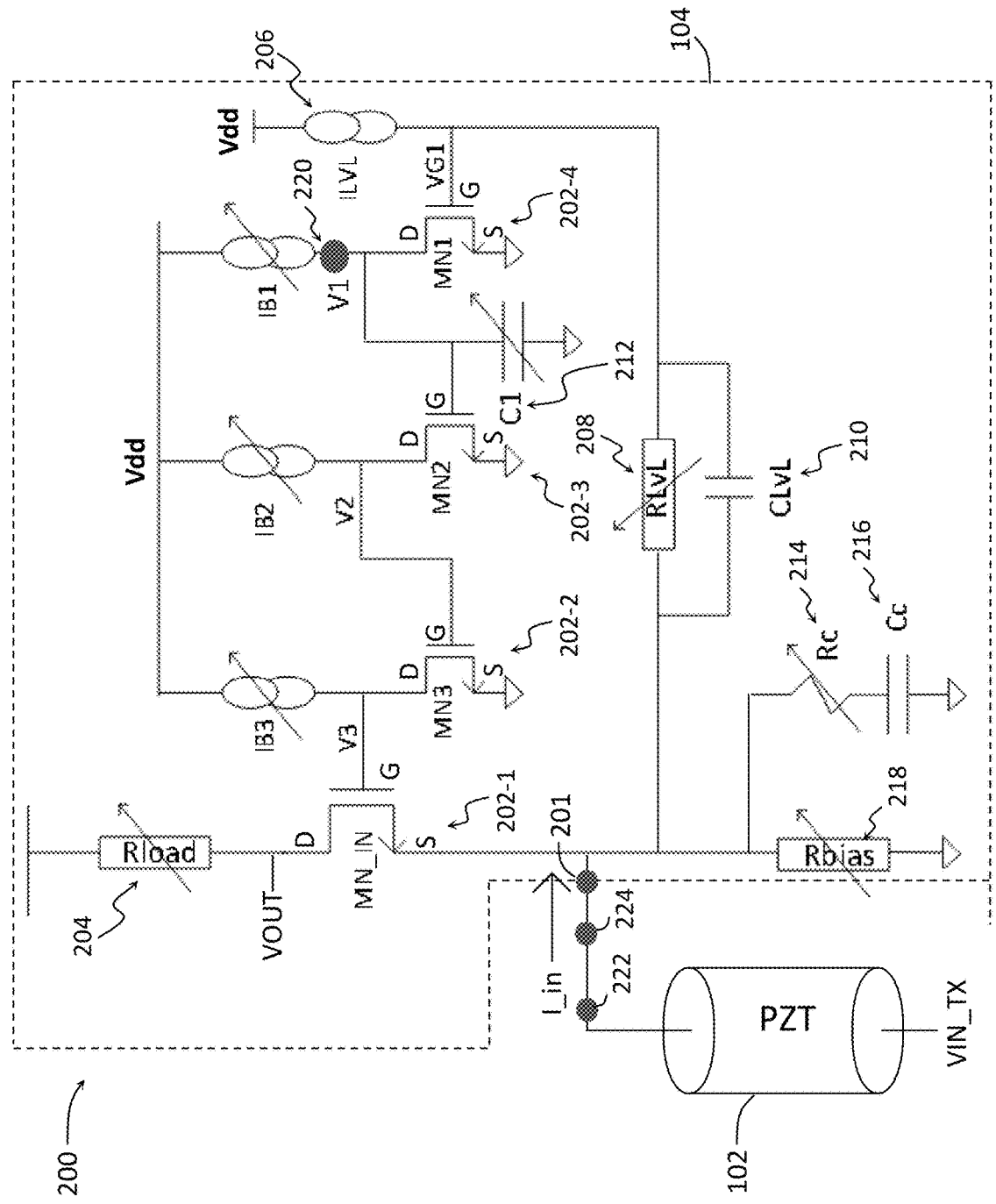
FIGS. 2 and 3 illustrate different examples of an ultrasonic front-end receiver according to some embodiments of the present disclosure.

FIG. 2 provides a first example of an ultrasonic front-end receiver 200 according to some embodiments of the present disclosure. The ultrasonic front-end receiver 200 may be included as part of the ultrasonic sensor system 100. For example, the PZT shown in FIG. 2 may implement the PZT 102 of FIG. 1, and the circuitry labeled as 104 in FIG. 2 may be used to implement the TIA 104 of FIG. 1. As shown in FIG. 2, the output of the PZT 102 may be coupled to an input port 201 to the TIA 104.

As shown in FIG. 2, in some embodiments, the TIA 104 may include 4 transistors 202, e.g., 4 metal-oxide-semiconductor field-effect transistors (MOSFETs), labeled as transistors 202-1, 202-2, 202-3, and 202-4, respectively, where source, drain, and gain terminals of each of the transistors 202 are labeled with letters S, D, and G, respectively. Each of the transistors 202-2, 202-3, and 202-4 is a CS amplifier, while the transistor 202-1 is a CG amplifier. Thus, the TIA 104 shown in FIG. 2 may be seen as including a multi-stage amplifier arrangement that includes 3 CS amplifiers in feedback with a CG amplifier. In other words, together, the second, third, and fourth transistors 202-2, 202-3, 202-4 may be seen as forming a feedback loop of the TIA 104, where the fourth transistor 202-4 may provide the first stage of the feedback loop, the third transistor 202-3 may provide the second stage of the feedback loop, and the second transistor 202-2 may provide the third stage of the feedback loop. However, it should be noted that, while FIG. 2 illustrates 3 CS amplifiers (i.e., three gain stages), in other embodiments, other numbers of N CS amplifiers, where N is an integer greater than 1, may be used. Figures presented herein illustrate three gain stages because, in some embodiments, this number of stages may represent an optimum balance in the ability to stabilize the loop (having more gain stages may be more difficult to implement, while having an even number of gain stages may produce instability) and sufficient loop gain to minimum input impedance (too few gain stage and the gain per stage may not be high enough to produce the desired low input impedance).

It should also be noted that FIG. 2 illustrates the transistors 202 to be N-type metal-oxide-semiconductor (MOS), NMOS, transistors (as indicated in FIG. 2 with the use of labels "MN", namely MN_IN, MN3, MN2, and MN1 for the transistors 202-1, 202-2, 202-3, and 202-4, respectively). However, in other embodiments, the transistors 202 may be implemented as P-type MOS, PMOS, transistors, all of which being within the scope of the present disclosure. The changes to biasing, etc., when switching between NMOS and PMOS transistors is well known to those skilled in the art and, therefore, in the interests of brevity are not explained here but embodiments with such changes are within the scope of the present disclosure.

As shown in FIG. 2, the first transistor 202-1 may be configured to receive an input current (I_in) at its source terminal, e.g., from the PZT 102. In operation, the PZT 102 may be excited by an ultrasonic transmitter, schematically represented in FIG. 2 as voltage VIN-TX being provided to the PZT 102, which causes the PZT 102 to generate the input current I_in to flow into the input port 201 of the TIA 104 to be converted by the TIA 104 to a voltage VOUT after being conveyed by the CG transistor 202-1 (i.e., the output voltage VOUT is provided at the drain terminal of the first transistor 202-1) and dropped across the variable load resistor Rload, 204.

Input current I_IN may be incident at the source of the CG amplifier, i.e., the transistor 202-1. With the configuration of the TIA 104 as shown in FIG. 2, a low input impedance, Zin, may advantageously be presented to the sensor PZT 102. A low input impedance may mean that, substantially independent of how high or how low the input current I_IN may be, at a given process and temperature corner, the voltage at the input port 201 to the TIA 104 (i.e., the voltage at I_IN) remains substantially constant (i.e., the voltage at I_IN is substantially pinned or substantially stays fixed). For a voltage at I_IN to be fixed, a feedback loop is included in the TIA 104 to monitor that voltage. Such a feedback loop may be provided by including a sequence of a plurality of CS amplifiers, e.g., 3 CS amplifiers, implemented as CS transistors 202-2, 202-3, and 202-4, shown in FIG. 2. Employing a plurality of such amplifiers may enable a feedback loop with negative feedback, a relatively high open loop gain, and high frequency operation.

Further as shown in FIG. 2, the second transistor 202-2 may have a drain terminal coupled to a gate terminal of the first transistor 202-1. The third transistor 202-3 may have a drain terminal coupled to a gate terminal of the second transistor 202-2. Finally, the fourth transistor 202-4 may have a drain terminal coupled to a gate terminal of the third transistor 202-3. The gate terminal of the fourth transistor 202-4 may be coupled to the current source from which the first transistor 202-1 is configured to receive the input current 204, i.e., the gate terminal of the fourth transistor 202-4 is also coupled to the input current 204, e.g., by being coupled to the input port 201 to the TIA 104 (i.e. by being coupled to the output of the PZT 102), as shown in FIG. 2. The drain terminals of the 3 CS transistors 202-2, 202-3, and 202-4, may be coupled to bias currents IB3, IB2, and IB1, respectively, as shown in FIG. 2.

In some embodiments, the bias currents IB2 and IB3 may be proportional-to-absolute-temperature (PTAT) currents generated by a bandgap voltage reference circuit with a complementary-to-absolute-temperature (CTAT) voltage. Making 1B2 and 1B3 CTAT may advantageously result in a relatively low temperature coefficient of an input impedance, Zin, for the TIA 104. In general, temperature compensation of the input impedance Zin of CG amplifier may be achieved by means of using PTAT/CTAT bias currents at various stages in the TIA 104.

Generation of the bias current IB1 is discussed in greater detail below, e.g., with reference to FIG. 4. In particular, as described in greater detail below, the TIA 104 may be advantageously designed to have stability across process, supply voltage, and temperature variations by generating a PVT-dependent bias current IB1.

In some embodiments, the TIA 104 may exhibit particularly low noise, which may be achieved by one or more of the following: having relatively high gain of the amplifier implemented by the fourth transistor 202-4 compared to the amplifier implemented by the third transistor 202-3 and the second transistor 202-2, having a high transconductance gm for the amplifier implemented by the fourth transistor 202-4, having a low transconductance gm for the bias current IB1, and having sufficiently large CLvL 210, the latter described in greater detail below in reference to level shifting.

In some embodiments, the TIA 104 may include a direct-current (DC) level shifter configured to try to ensure that the voltage at the gate of a transistor used to implement the first CS gain stage of the feedback loop (i.e., the voltage VG1 at the gate of the transistor 202-4 for the embodiment shown in FIG. 2) is shifted by a certain amount with respect to the voltage at the input port 201 to the TIA 104. In general, such a level shifter may be coupled between the gate terminal of the first CS gain stage of the feedback loop (i.e., the gate terminal of the fourth transistor 202-4) and the input port 201 to the TIA, and may be implemented as a current source ILvL 206 and a resistor RLvL 208, shown in FIG. 2, where the current source ILvL is configured to provide DC current that is to flow through the resistor RLvL. As shown in FIG. 2, each of the current source ILVL 206 and the resistor RLvL 208 is coupled to the gate terminal of the first CS gain stage of the feedback loop. In particular, the resistor RLvL 208 may be coupled between the gate terminal of the first CS gain stage of the feedback loop of the TIA 104 and the input port 201 to the TIA 104. The ILVL 206 and the RLvL 208 may be used to decouple the DC bias point at VG1, i.e., at the gate of the fourth transistor 202-4, and the source of the first transistor 202-1. In general, the gate voltage VG1 of the fourth transistor 202-4 may be substantially equal to a sum of the source voltage VS of the first transistor 202-1 and a product of values of ILVL and RLvL. Such a level shifter may act on DC current, by the DC current generated by the ILVL going through the RLvL, so that, independent of the voltage on I_IN, the voltage on VG1 is going to be higher than that by RLvL*ILVL, which allows the circuit of the TIA 104 to bias cleanly and in a simple manner.

While the level shifter of ILvL and RLvL as shown in FIG. 2 provides DC feedback needed for biasing by ensuring that VG1 can be DC-coupled to I_IN by including RLvL, VG1 also should be alternating current (AC)-coupled to I_IN so that the sensor current I_IN can be properly converted to voltage VOUT. To that end, besides the ILVL 206 and the RLvL 208, the TIA 104 may further include a capacitor CLvL 210, coupled in electrical parallel to the RLvL 208 (i.e., coupled so that one capacitor electrode is coupled to the gate of the fourth transistor 202-4 and the other capacitor electrode is coupled to the input port 201), in order to provide a high-bandwidth signal path (i.e., so that the AC current can go around, or bypass, the RLvL 208). Thus, for DC feedback needed for biasing, VG1 may be DC-coupled to I_IN, which may be accomplished by including the RLvL 208, while for AC feedback needed for the actual ultrasound sensing, VG1 may be AC-coupled to I_IN, which may be accomplished by including the CLvL 210. In various embodiments, each of ILVL 206, RLvL 208, and CLvL 210 can be variable (e.g., programmable) or fixed.

In some embodiments, stability across sensor range may be implemented by using a capacitor C1 212 and a resistor Rc 214 as shown in FIG. 2. The capacitor C1 may have one capacitor electrode coupled to each of: the gate terminal of the third transistor 202-3, and the drain terminal of the fourth transistor 202-4. The other capacitor electrode of the capacitor C1 may be coupled to ground (in FIG. 2, ground potential is illustrated with a triangle, as common in circuit schematics). The resistor Rc may be coupled between the input port 201 and the ground. In some embodiments, the capacitor C1 and/or the resistor Rc may be variable. In such embodiments, the feedback loop of the TIA 104 may be made stable by adjusting the values of C1 and Rc depending on the high frequency characteristics of the PZT 102, e.g., depending on such factors as the electrical model of the PZT elements and the parasitic impedances that accumulate between the PZT sensor and the TIA as, depending on the system configuration, TIA and PZT may not be proximate. Implementing C1 and Rc as variable elements with having sufficiently wide range of values may advantageously allow supporting a wide variety of PZT sensor and interconnect characteristics. In some embodiments, stability across sensor range may also be provided by suitable switching of the capacitor C1—in particular, by switching C1 using a higher voltage domain but with lower voltage devices in an attempt to reduce device parasitic capacitances, thus extending the usable range of PZT sensor characteristics. In such a situation, protection of the low voltage (but higher bandwidth) device may need to be managed by the effect to produce superior impedance control over frequency. In some embodiments, a capacitor Cc 216 may be provided between the resistor Rc and the ground, i.e., the capacitor Cc may be connected to the resistor Rc in electrical series. Such a capacitor may be useful for dominant pole compensation with the resistor providing a Left Half Plane Zero at high frequencies.

FIG. 2 further illustrates that, in some embodiments, the TIA 104 may include a variable resistor Rbias 218, coupled between the input port 201 and the ground, which may be in electrical parallel to the variable resistor Rc and the capacitor Cc. The resistor Rbias may be a programmable bias generating resistor configured to provide sufficient biasing current to ensure that the the TIA can work with substantially no loss of performance at the maximum specified input current. Furthermore, the level of current may impact the noise of the TIA.

Figure 5:
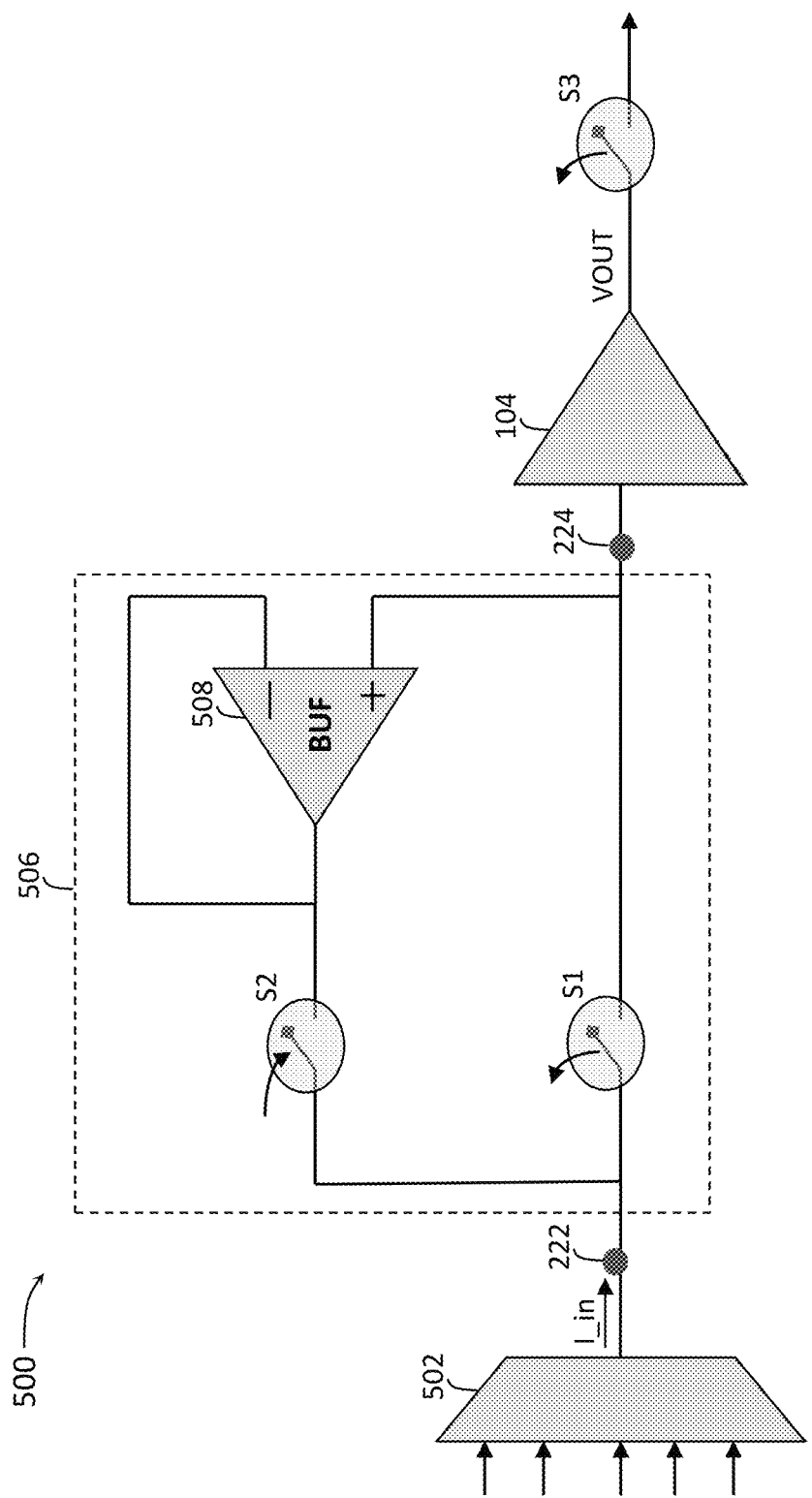
FIG. 5 provides a block diagram illustrating overload protection that may be used with an ultrasonic front-end receiver according to some embodiments of the present disclosure.

Also shown in FIG. 2 are node 220, which is a node where the bias current IB1 is injected into the circuitry of the TIA 104, and nodes 222 and 224, which illustrate an example location for placement of an optional overload protection circuit, e.g., as the one shown in FIG. 5, in case such a circuit is used.

Figure 3:
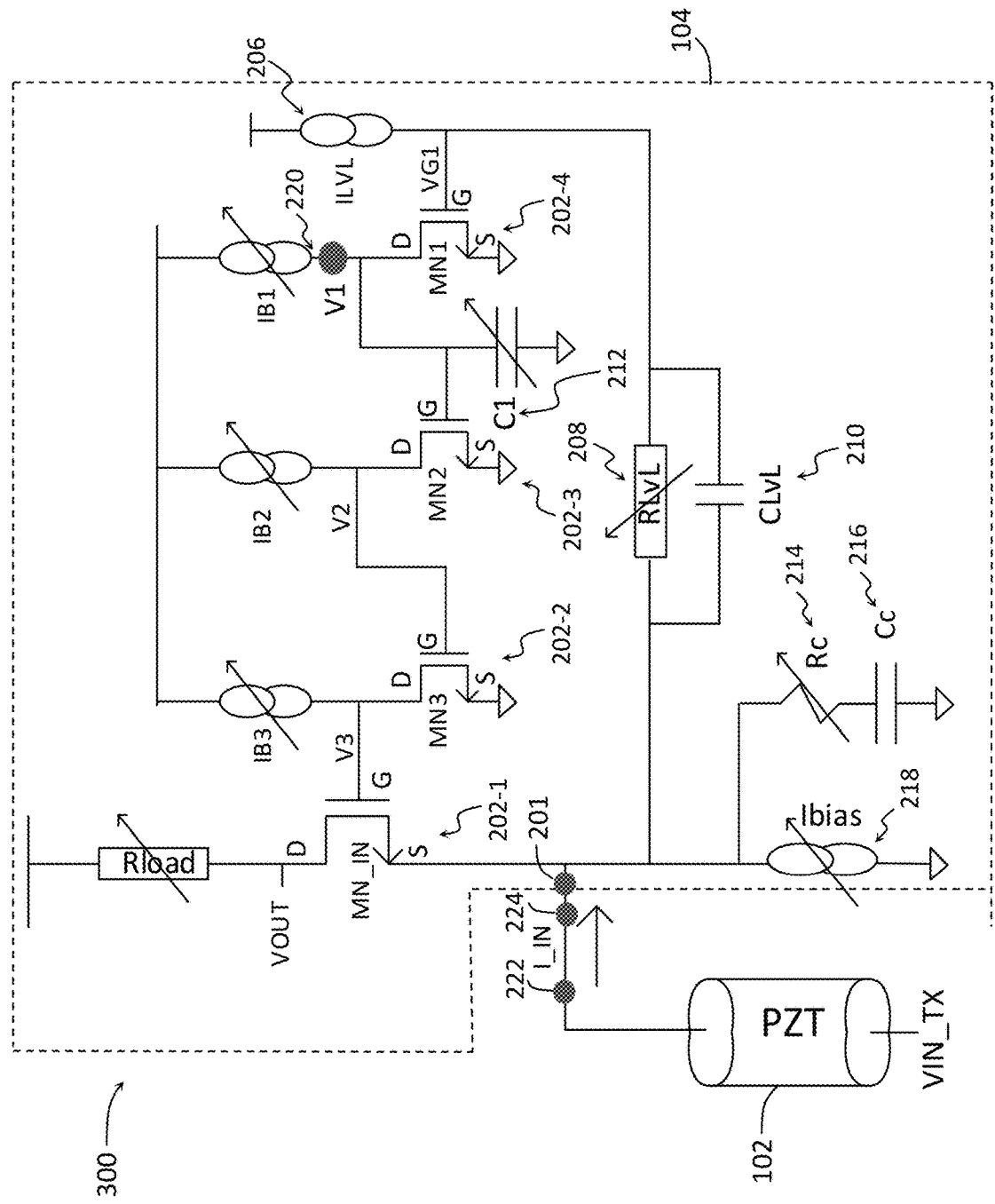

FIG. 3 provides a second example of an ultrasonic front-end receiver 300 according to some embodiments of the present disclosure. Comparison of FIGS. 2 and 3 reveals that the receiver 300 includes many of the same components as those shown in FIG. 2. Description of those components provided with reference to FIG. 2 are applicable to FIG. 3 and, in the interest of brevity, is not repeated here. Therefore, only the differences between FIGS. 2 and 3 are described. In particular, as shown in FIG. 3, in the front-end receiver 300, the bias resistor Rbias 218 of the front-end receiver 200 shown in FIG. 2 is replaced with a variable bias current generator Ibias 318. Replacing Rbias with Ibias, which, in turn, could be made a PTAT current in some embodiments, may advantageously provide an even lower temperature coefficient for the input impedance Zin. In some embodiments, Ibias 318 may be a process-dependent and temperature-dependent bias current source, i.e., a current source configured to generate a bias current that is fabrication process- and temperature-dependent. In some embodiments, using the Ibias 318 may enable a Zin temperature coefficient below about 0.5%. In some embodiments, using a bias current, for example as opposed to a resistor, may provide improved options to manage the total operating room/headroom of the TIA.

Figure 4:
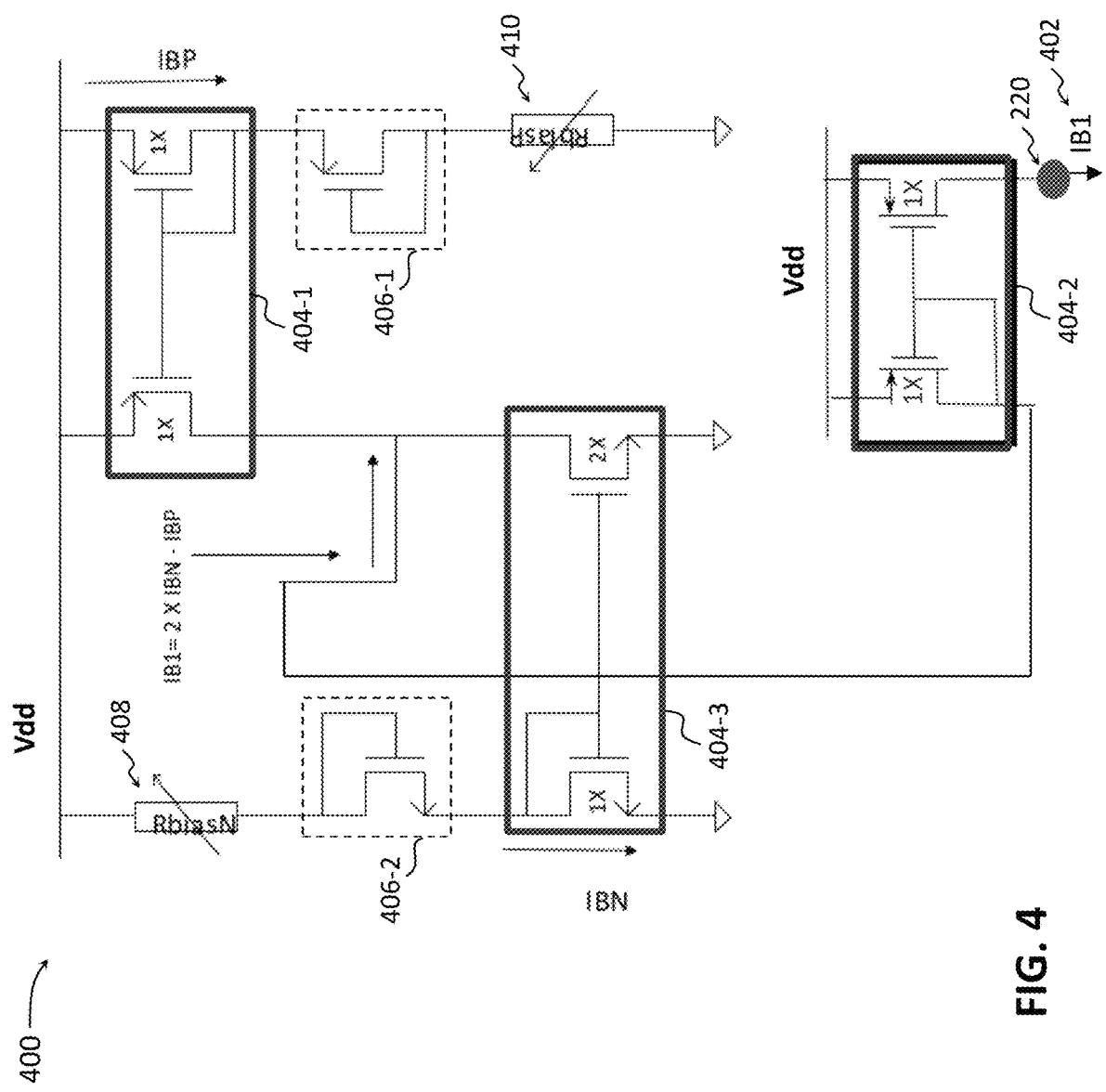
FIG. 4 illustrates a transistor level bias generation circuit that may be used with ultrasonic front-end receivers according to some embodiments of the present disclosure.

FIG. 4 provides a schematic illustration of a bias generation circuit 400 that may be used with ultrasonic front-end receivers according to some embodiments of the present disclosure, e.g., with the ultrasonic front-end receivers 200 or 300, described above. The circuit 400 may be used to produce a bias current that varies as a function of the supply voltage and transistors' process corner. For example, the bias generation circuit 400 may be the variable bias current source IB1 shown in FIG. 2 or 3, and the output current IB1 402 of the bias generation circuit 400 may be applied to the TIA 104 at a node 220 shown in FIG. 2 (i.e., the bias current IB1 is the current configured to bias the transistor of the first CS gain stage of the feedback loop of the TIA 104 (i.e., the current configured to bias the transistor 202-4 for the embodiment shown in FIG. 2). In general, according to various embodiments of the present disclosure, the bias current IB1 may be a PVT-dependent bias current, i.e., a bias current configured to track the variation in the supply of the circuit and also to track the devices parameter variation in the transistors used to in the designer of the bias circuit (which are advantageously) the same type as those used in the TIA. Various circuits may be used for this purpose, with FIG. 4 providing one suitable example. However, embodiments of the present disclosure are not limited to IB1 generated by the circuit 400 shown in FIG. 4.

As shown in FIG. 4, in some embodiments, the bias current IB1 may be generated using three current mirrors, shown in FIG. 4 as a first current mirror 404-1, a second current mirror 404-2, and a third current mirror 404-3, and two diode-connected MOSFETs, shown in FIG. 4 as a first diode-connected MOSFET 406-1, and a second diode-connected MOSFET 406-2. FIG. 4 further illustrates a variable resistor RbiasN 408, configured to convert the difference between the supply voltage and the voltage dropped across the diode-connected N-type MOSFET 406-2 to a voltage- and N-type MOSFET-process-dependent current. FIG. 4 further illustrates a variable resistor RbiasP 410, configured to convert the difference between the supply voltage and the voltage dropped across the diode-connected P-type MOSFET 406-1 to a voltage- and P-type MOSFET-process-dependent current. As shown in FIG. 4, the first diode-connected MOSFET 406-1 may be coupled between the first current mirror 404-1 and the variable resistor RbiasP 410, the second current mirror 404-2 may be coupled between the first current mirror 404-1 and the third current mirror 404-3, and the second diode-connected MOSFET 406-2 may be coupled between the third mirror 404-3 and the variable resistor RbiasN 408. As also shown in FIG. 4, each of the first and second current mirrors may implement 1:1 current replication, while the third current mirror 404-3 may implement 1:2 current replication. If the current through a diode-connected MOSFET of the first current mirror 404-1 is denoted IBP and the current through a diode-connected MOSFET of the third current mirror 404-3 is denoted IBN, then the bias current IB1 generated by the bias generation circuit 400 is IB1=2×IBN−IBP. Similar to the notation used in FIG. 2, connections to the potential Vdd are shown in FIG. 4, with the triangles shown in FIG. 4 indicating a connection to ground.

FIG. 5 provides a block diagram illustrating overload protection arrangement 500 that may be used with an ultrasonic front-end receiver according to some embodiments of the present disclosure. The arrangement 500 illustrates a multiplexer 502 which may, optionally, be used to multiplex currents from multiple PZTs 102 to be converted by a single TIA 104, also indicated in FIG. 5. FIG. 5 further illustrates an example overload protection circuit 506 provided between the nodes 222 and 224 which were shown in FIGS. 2 and 3, i.e., in the path of the input current I_in before it is provided to the input port 201 of the TIA 104. FIG. 5 also illustrates the input current I_in and the output voltage VOUT, as described above with reference to FIGS. 2 and 3.

As shown in FIG. 5, in some embodiments, the overload protection circuit 506 may include a first switch S1 and a second switch S2, where the second switch S2 is in parallel with the first switch S1. The second switch S2 may be coupled to a buffer 508 configured to sink the overload current when an overload condition is active (e.g., as identified by some kind of control logic, or a controller, configured to identify such conditions). In operation, when the first switch S1 is open, the second switch S2 may be closed, and vice versa. In this way, the input current I_in either travels through the first switch S1 (when the first switch S1 is closed and the second switch S2 is open) and reaches the TIA 104 to be converted into output voltage VOUT by the TIA 104, when there is no overload indicated, or the input current I_in travels through the second switch S2 (the first switch S1 is open and the second switch S2 is closed) to be dissipated by the buffer 508 when there is an overload condition. In this manner, the overload protection circuit 506 is configured to limit the maximum current provided to the TIA 104 in order to reduce or eliminate scenarios where the TIA 104 is overloaded/saturated, which may be detrimental to the operation of the TIA 104.

A third switch S3 shown in FIG. 5 may be used, optionally, to allow other instance(s) of the LNA (other instance(s) not specifically shown in FIG. 5) to be selected. This would allow, for example, for different performance/power/area trade-offs where a single instance can't be designed to offer sufficient flexibility. In the context of the fingerprint sensing applications, the requirements to sense through different materials (e.g. glass, OLED displays, metal, etc.) might drive fundamentally different circuit design optimizations. Although not specifically shown in the present figures, the ultrasound sensor system 100, or the front-end receivers 200 or 300, may also include a controller configured to open and close switches S1, S2, and S3 in accordance with the descriptions provided herein.

In other embodiments, overload protection circuits other than the circuit 506 shown in FIG. 5 may be implemented to limit the input current I_IN applied to the input port 201 of the TIA 104 to a value that does not exceed a maximum threshold value.

Select Examples

Example 1 provides TIA of an ultrasonic front-end receiver, the TIA configured to convert an input current (I_IN) applied to an input port of the TIA to an output voltage (VOUT), the input current indicative of (e.g., being equal to) a current generated by a piezoelectric transducer (PZT). The TIA may include a first field-effect transistor (T1) configured to receive an input current (I_in) at a source terminal of the first transistor coupled to the input port; a second field-effect transistor (T2) having a drain terminal coupled to a gate terminal of the first transistor; a third field-effect transistor (T3) having a drain terminal coupled to a gate terminal of the second transistor; and a fourth field-effect transistor (T4) having a drain terminal coupled to a gate terminal of the third transistor. Together, the second, third, and fourth transistors may be seen as forming a feedback loop of the TIA, where the fourth transistor provides the first stage of the feedback loop, the third transistor provides the second stage of the feedback loop, and the second transistor provides the third stage of the feedback loop. In some embodiments, the second transistor may be omitted.

Example 2 provides the TIA according to example 1, where a gate terminal of the fourth transistor is coupled to a current source from which the first transistor is configured to receive the input current. Thus, the first transistor may be in feedback with the second, third, and fourth transistors.

Example 3 provides the TIA according to example 2, where the current source from which the first transistor is configured to receive the input current is a piezoelectric sensor (PZT). The PZT is excited by an ultrasonic transmitter, VIN_TX, that causes the current I_in to flow into the front-end amplifier arrangement according to any one of the examples, which current is converted into an output voltage VOUT by the amplifier arrangement (i.e., the amplifier arrangement is a TIA amplifier).

Example 4 provides the TIA according to examples 2 or 3, further including a level shifter that includes a variable resistor element (RLvL) (i.e., an element, resistance of which may be adjusted) coupled between the gate terminal of the fourth transistor and the input port of the TIA, and a bias current source (ILVL) coupled to the gate terminal of the fourth transistor.

Example 5 provides the TIA according to example 4, further including a capacitor (CLvL) coupled between the gate terminal of the fourth transistor and the input port of the TIA (i.e., such a capacitor is in electrical parallel with the resistor of example 4, and may be used, e.g., to provide a high-bandwidth signal path.

Example 6 provides the TIA according to any one of examples 2-5, further including a variable resistor element (Rc) coupled between the input port of the TIA and a ground potential. Such a variable resistor element may be coupled to the gate terminal of the fourth transistor via the resistor element RLvL, in case the level shifter is implemented.

Example 7 provides the TIA according to example 6, where the variable resistor element is coupled (e.g., connected in series) with a capacitor element (Cc), which capacitor element is connected to ground.

Example 8 provides the TIA according to examples 6 or 7, where the gate terminal of the third transistor is coupled to a variable capacitor element (C1) (i.e., an element, capacitance of which may be adjusted).

Example 9 provides the TIA according to any one of the preceding examples, further including a bias current source configured to generate a bias current for biasing the fourth transistor (or, in general, to generate a bias current for biasing a first CG stage of the feedback loop), where the bias current is dependent on one of more of process variations, supply voltage variations, and temperature variations.

Example 10 provides the TIA according to any one of the preceding examples, further including an overload protection circuit configured to limit the input current applied to the input port of the TIA to a value that does not exceed a maximum threshold value.

Example 11 provides the TIA according to any one of the preceding examples, where the first transistor is a CG transistor (i.e., a transistor of a CG amplifier included as a first stage of the amplifier arrangement).

Example 12 provides the TIA according to any one of the preceding examples, where each of the second transistor, the third transistor, and the fourth transistor is a CS transistor (i.e., a transistor of a respective CS amplifier included as a respective (i.e., second, third, and fourth) stage of the amplifier arrangement).

Example 13 provides the TIA according to any one of the preceding examples, where a source terminal of each of the second transistor, the third transistor, and the fourth transistor is coupled to a ground potential.

Example 14 provides the TIA according to any one of the preceding examples, where the TIA is configured to provide the output voltage (VOUT) at a drain terminal of the first transistor.

Example 15 provides an ultrasonic sensor system, the system including an ultrasonic receiver and a TIA. The ultrasonic receiver may be configured to receive (RX) an RX ultrasonic signal, the RX ultrasonic signal including at least a portion of a transmitted (TX) ultrasonic signal that has interacted with an object (e.g., a portion of a human finger containing the friction ridges), where the TX ultrasonic signal is an ultrasonic signal (e.g., an ultrasonic pulse) transmitted by an ultrasonic transmitter configured to transmit the TX ultrasonic signal so that the TX ultrasonic signal interacts with (e.g., is at least partially reflected by, possibly after being partially absorbed by) the object, and generate a first electrical signal (e.g., a current I_in) that is indicative of the RX ultrasonic signal. The TIA may be a TIA according to any one of the preceding examples (e.g., any one of examples 1-14), and may be configured to convert the first electrical signal generated by the ultrasonic receiver to a second electrical signal (e.g., a voltage VOUT).

Example 16 provides the ultrasonic sensor system according to example 15, where the system includes a plurality of pixels (e.g., an array of pixels), each of the plurality of pixels including a respective (i.e., different instance of) ultrasonic receiver according to example 15.

Example 17 provides the ultrasonic sensor system according to example 16, where the system includes a respective (i.e., different instance of) TIA according to example 15 at least for one or more of the plurality of pixels.

Example 18 provides the ultrasonic sensor system according to example 16, where the TIA according to example 15 is configured to convert the first electrical signal generated by two or more of the plurality of pixels.

Example 19 provides the ultrasonic sensor system according to any one of examples 15-18, where the ultrasonic receiver is a piezoelectric sensor.

Example 20 provides the ultrasonic sensor system according to any one of examples 15-19, where the system is a fingerprint sensing system.

Example 21 provides the ultrasonic sensor system according to any one of examples 15-19, where the system further includes the ultrasonic transmitter.

Example 22 provides an integrated circuit (IC) device that includes a substrate and a TIA according to any one of the preceding examples (e.g., any one of examples 1-14) provided over/on the substrate and/or an ultrasonic sensor system according to any one of the preceding examples (e.g., any one of examples 15-21).

Example 23 provides the IC device according to example 22, where the IC device is coupled to a further IC component.

Example 24 provides the IC device according to example 23, where the further IC component is one of an interposer, a circuit board, a flexible board, or a package substrate Example 25 provides a computing device, including a TIA according to any one of the preceding examples (e.g., any one of examples 1-14) and/or an ultrasonic sensor system according to any one of the preceding examples (e.g., any one of examples 15-21) and/or an IC device according to any one of the preceding examples (e.g., any one of examples 22-24).

Example 26 provides the computing device according to example 25, where the mobile device is a wearable or a handheld device (e.g., a mobile phone or a tablet computer).

Other Implementation Notes, Variations, and Applications

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

In one example embodiment, any number of electrical circuits of the FIGS. may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGS. may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the digital filters may be implemented in one or more silicon cores in ASICs, FPGAs, and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular arrangements of components. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGS. may be combined in various possible configurations, all of which are clearly within the broad scope of the present disclosure. In certain cases, it may be easier to describe one or more of the functionalities of a given set of flows by only referencing a limited number of electrical elements. It should be appreciated that the electrical circuits of the FIGS. and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in the present disclosure, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to current-to-voltage conversion in front-end ultrasonic receivers, e.g. those summarized in the one or more figures presented herein, illustrate only some of the possible functions that may be executed by, or within, the ultrasonic sensor system illustrated in the FIGS. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

The invention claimed is:

1. A transimpedance amplifier (TIA) of an ultrasonic front-end receiver, the TIA configured to convert an input current applied to an input port of the TIA to an output voltage, the input current indicative of a current generated by a piezoelectric transducer (PZT), the TIA comprising:
   a first transistor, configured to receive the input current at a source terminal of the first transistor;
   a second transistor, having a drain terminal coupled to a gate terminal of the first transistor;
   a third transistor, having a drain terminal coupled to a gate terminal of the second transistor; a fourth transistor, having a drain terminal coupled to a gate terminal of the third transistor; and
   a bias current source, configured to generate a bias current for biasing the fourth transistor, where the bias current is dependent on one of more of process variations, supply voltage variations, and temperature variations.

2. The TIA according to claim 1, wherein a gate terminal of the fourth transistor is coupled to a current source from which the first transistor is configured to receive the input current.

3. The TIA according to claim 2, wherein the current source from which the first transistor is configured to receive the input current is a piezoelectric sensor.

4. The TIA according to claim 2, further comprising a level shifter that includes:
   a resistor element coupled between the gate terminal of the fourth transistor and the input port of the TIA, and
   a bias current source coupled to the gate terminal of the fourth transistor.

5. The TIA according to claim 4, further comprising:
   a capacitor coupled between the gate terminal of the fourth transistor and the input port of the TIA.

6. The TIA according to claim 2, further comprising:
   a variable resistor element coupled between the input port of the TIA and a ground potential.

7. The TIA according to claim 6, wherein the variable resistor element is coupled with a capacitor element.

8. The TIA according to claim 6, wherein the gate terminal of the third transistor is coupled to a variable capacitor element.

9. The TIA according to claim 1, further comprising an overload protection circuit configured to limit the input current applied to the input port of the TIA to a value that does not exceed a maximum threshold value.

10. The TIA according to claim 1, wherein the first transistor is a common-gate transistor.

11. The TIA according to claim 1, wherein each of the second transistor, the third transistor, and the fourth transistor is a common-source transistor.

12. The TIA according to claim 1, wherein a source terminal of each of the second transistor, the third transistor, and the fourth transistor is coupled to a ground potential.

13. The TIA according to claim 1, wherein the TIA is configured to provide the output voltage at a drain terminal of the first transistor.

14. A transimpedance amplifier (TIA) of an ultrasonic front-end receiver, the TIA configured to convert an input current applied to an input port of the TIA to an output voltage, the input current indicative of a current generated by a piezoelectric transducer (PZT), the TIA comprising:
- a first transistor configured to receive the input current at a source terminal of the first transistor;
- a second transistor having a drain terminal coupled to a gate terminal of the first transistor;
- a third transistor having a drain terminal coupled to a gate terminal of the second transistor;
- a fourth transistor having a drain terminal coupled to a gate terminal of the third transistor; and
- an overload protection circuit configured to limit the input current applied to the input port of the TIA to a value that does not exceed a maximum threshold value.

15. The TIA according to claim 14, further comprising a level shifter that includes:
- a resistor element coupled between the gate terminal of the fourth transistor and the input port of the TIA, and
- a bias current source coupled to the gate terminal of the fourth transistor.

16. The TIA according to claim 15, further comprising a variable resistor element coupled between the input port of the TIA and a ground potential.

17. The TIA according to claim 16, wherein a source terminal of each of the second transistor, the third transistor, and the fourth transistor is coupled to a ground potential.

18. A transimpedance amplifier (TIA) of an ultrasonic front-end receiver, the TIA configured to convert an input current applied to an input port of the TIA to an output voltage, the input current indicative of a current generated by a piezoelectric transducer (PZT), the TIA comprising:
- a first transistor configured to receive the input current at a source terminal of the first transistor;
- a second transistor having a drain terminal coupled to a gate terminal of the first transistor;
- a third transistor having a drain terminal coupled to a gate terminal of the second transistor;
- a fourth transistor having a drain terminal coupled to a gate terminal of the third transistor; and
- a level shifter that includes:
  - a resistor element coupled between a gate terminal of the fourth transistor and the input port of the TIA, and
  - a bias current source coupled to the gate terminal of the fourth transistor.

19. The TIA according to claim 18, further comprising a variable resistor element coupled between the input port of the TIA and a ground potential.

20. The TIA according to claim 18, wherein a source terminal of each of the second transistor, the third transistor, and the fourth transistor is coupled to a ground potential.

21. A transimpedance amplifier (TIA) of an ultrasonic front-end receiver, the TIA configured to convert an input current applied to an input port of the TIA to an output voltage, the input current indicative of a current generated by a piezoelectric transducer (PZT), the TIA comprising:
- a first transistor configured to receive the input current at a source terminal of the first transistor;
- a second transistor having a drain terminal coupled to a gate terminal of the first transistor;
- a third transistor having a drain terminal coupled to a gate terminal of the second transistor;
- a fourth transistor having a drain terminal coupled to a gate terminal of the third transistor; and
- a variable resistor element coupled between the input port of the TIA and a ground potential.

22. The TIA according to claim 21, wherein a source terminal of each of the second transistor, the third transistor, and the fourth transistor is coupled to a ground potential.

23. A transimpedance amplifier (TIA) of an ultrasonic front-end receiver, the TIA configured to convert an input current applied to an input port of the TIA to an output voltage, the input current indicative of a current generated by a piezoelectric transducer (PZT), the TIA comprising:
- a first transistor configured to receive the input current at a source terminal of the first transistor;
- a second transistor having a drain terminal electrically connected to a gate terminal of the first transistor;
- a third transistor having a drain terminal coupled to a gate terminal of the second transistor; and
- a fourth transistor having a drain terminal coupled to a gate terminal of the third transistor.

* * * * *